United States Patent
Lee et al.

(10) Patent No.: US 12,513,877 B2
(45) Date of Patent: Dec. 30, 2025

(54) INTEGRATED CIRCUIT INCLUDING STATIC RANDOM ACCESS MEMORY DEVICE

(71) Applicant: Samsung Electronics Co., Ltd., Suwon-si (KR)

(72) Inventors: Eo Jin Lee, Suwon-si (KR); Ho Young Tang, Suwon-si (KR); Tae-Hyung Kim, Suwon-si (KR); Dae Young Moon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 18/201,465

(22) Filed: May 24, 2023

(65) Prior Publication Data

US 2023/0389258 A1    Nov. 30, 2023

(30) Foreign Application Priority Data

May 27, 2022  (KR) .................. 10-2022-0065338
Aug. 23, 2022  (KR) .................. 10-2022-0105592

(51) Int. Cl.
   *H10B 10/00*   (2023.01)
(52) U.S. Cl.
   CPC ................. *H10B 10/125* (2023.02)
(58) Field of Classification Search
   CPC ....... H10B 10/125; H10B 10/12; H10D 89/10

USPC .......................................................... 365/63
See application file for complete search history.

(56) References Cited

U.S. PATENT DOCUMENTS

| | | | |
|---|---|---|---|
| 7,286,438 B2 | 10/2007 | Lien et al. | |
| 8,009,463 B2 | 8/2011 | Liaw | |
| 8,605,491 B2 | 12/2013 | Liaw | |
| 9,006,841 B2 | 4/2015 | Kumar et al. | |
| 9,099,172 B2 | 8/2015 | Liaw | |
| 10,916,296 B2 | 2/2021 | Zhou | |
| 11,133,322 B2 | 9/2021 | Wu et al. | |
| 2006/0019488 A1* | 1/2006 | Liaw | H10B 10/00 257/E27.099 |
| 2022/0392904 A1* | 12/2022 | Liaw | H01L 23/528 |

* cited by examiner

*Primary Examiner* — Fernando Hidalgo
(74) *Attorney, Agent, or Firm* — Sughrue Mion, PLLC

(57) ABSTRACT

An integrated circuit includes a static random access memory (SRAM) device. The SRAM device includes an SRAM unit cell that includes a first output node to which a first pull-up transistor, a first pull-down transistor, and a second pull-down transistor are commonly connected, and a second output node to which a second pull-up transistor, a third pull-down transistor, and a fourth pull-down transistor are commonly connected. The first output node is connected to a first gate electrode, a second gate electrode, a first connection wiring line, a first node formation pattern, and a first active contact, and a layout of the first output node, the first gate electrode, the second gate electrode, the first connection wiring line, the first node formation pattern, and the first active contact forms a first fork shape.

20 Claims, 10 Drawing Sheets

INTEGRATED CIRCUIT INCLUDING STATIC RANDOM ACCESS MEMORY DEVICE

CROSS-REFERENCE TO RELATED APPLICATIONS

This application claims priority from Korean Patent Application No. 10-2022-0065338 filed on May 27, 2022 and Korean Patent Application No. 10-2022-0105592 filed on Aug. 23, 2022 in the Korean Intellectual Property Office, the contents of each of which being herein incorporated by reference in their entireties.

BACKGROUND

The present disclosure relates to an integrated circuit including a static random access memory device.

The technology related to semiconductor devices has achieved remarkable growth worldwide due to active demands of semiconductor users and constant efforts of semiconductor manufacturers, and continues to develop. Further, the semiconductor manufacturers are not satisfied with this and strive to achieve further miniaturization, high integration, and large capacity of semiconductor devices, and also accelerate research and development to perform a stable and smooth operation at a higher speed. Such efforts of the semiconductor manufacturers have brought progress in microprocessing technology, micro-device technology, and circuit design technology, which shows remarkable achievement in the technology of semiconductor memory cells such as a dynamic random access memory (DRAM) or a static random access memory (SRAM).

In particular, in the SRAM field, a dual port SRAM capable of performing high-speed read and write operations compared to a conventional single port SRAM has been developed.

SUMMARY

It is an aspect to provide an integrated circuit capable of improving device performance and reliability while reducing an area.

It is another aspect to provide an integrated circuit in which the area occupied by a cascade connection of a pull-down transistor is reduced.

According to an aspect of one or more embodiments, there is provided an integrated circuit comprising a static random access memory (SRAM) device, wherein the SRAM device comprises an SRAM unit cell comprising a first output node to which a first pull-up transistor, a first pull-down transistor, and a second pull-down transistor are commonly connected, and a second output node to which a second pull-up transistor, a third pull-down transistor, and a fourth pull-down transistor are commonly connected, wherein the first output node is connected to a first gate electrode, a second gate electrode, a first connection wiring line, a first node formation pattern, and a first active contact, and wherein a first layout of the first output node, the first gate electrode, the second gate electrode, the first connection wiring line, the first node formation pattern, and the first active contact forms a first fork shape.

According to another aspect of one or more embodiments, there is provided an integrated circuit comprising a plurality of SRAM unit cells each comprising a plurality of gate-all-around transistors; a plurality of active patterns sequentially arranged at intervals in a first direction, and extending in a second direction; a first gate electrode extending in the first direction of a first axis on the plurality of active patterns; a second gate electrode extending in the first direction of a second axis on the plurality of active patterns; a first connection wiring line extending in the second direction and crossing the first gate electrode and the second gate electrode on the first gate electrode and the second gate electrode; a first node formation pattern extending on the second gate electrode and having a first length in the second direction; a first active contact extending in the first direction of a third axis and crossing the first node formation pattern, wherein a first input/output node of the SRAM unit cell is connected to the first gate electrode, the second gate electrode, the first connection wiring line, the first node formation pattern, and the first active contact, and wherein a first layout of the first input/output node, the first gate electrode, the second gate electrode, the first connection wiring line, the first node formation pattern, and the first active contact forms a first fork shape.

According to yet another aspect of one or more embodiments, there is provided an integrated circuit comprising a first power wiring line extending in a first direction; a first gate electrode extending in a second direction of a first axis under the first power wiring line; a second gate electrode extending in the second direction of the first axis under the first power wiring line and spaced apart from the first gate electrode; a first active contact under the first power wiring line, the first active contact extending in the second direction of a second axis; a second active contact extending in the second direction of the second axis and disposed to be symmetrical to the first active contact with respect to the first power wiring line; a third gate electrode under the first power wiring line and extending in the second direction of a third axis; a fourth gate electrode under the first power wiring line and spaced apart from the third gate electrode, the fourth gate electrode extending in the second direction of the third axis; a first connection wiring line extending in the first direction and electrically connected to the first gate electrode and the second gate electrode; a second connection wiring line extending in the first direction and electrically connected to the third gate electrode and the fourth gate electrode; a first node formation pattern extending in the first direction and configured to electrically connect the second gate electrode and the first active contact; and a second node formation pattern extending in the first direction and configured to electrically connect the third gate electrode and the second active contact, wherein a first layout shape in which the first gate electrode, the first connection wiring line, the second gate electrode, the first node formation pattern, and the first active contact are connected is in point symmetry with a second layout shape in which the fourth gate electrode, the second connection wiring line, the third gate electrode, the second node formation pattern, and the second active contact are connected.

BRIEF DESCRIPTION OF THE DRAWINGS

The above and other aspects will become more apparent by describing in detail exemplary embodiments thereof with reference to the attached drawings, in which.

DETAILED DESCRIPTION

In this specification, one side or one direction and the other side or the other direction are used as a relative concepts for easy understanding. Accordingly, 'one side' and 'the other side' do not refer to a specific direction, location, or component, and may be interchangeable with each other. For example, 'one side' may be interpreted as 'the other side' and 'the other side' may be interpreted as 'one side'. Accordingly, 'one side' and 'the other side' may be expressed as 'first' as 'second', respectively, and 'the other side' and 'one side' may be expressed as 'first' and 'second', respectively. However, within one embodiment, 'one side' and 'the other side' are not used interchangeably. In this specification, both sides refer to both one side and the other side.

In this specification, a first direction, a second direction, and a third direction, or a D1 direction, a D2 direction, and a D3 direction are used as relative concepts for easy understanding. Therefore, the first direction, the second direction, and the third direction, or the D1 direction, the D2 direction, and the D3 direction do not refer to a specific direction and may be interchangeable with each other. In the following embodiments, the first direction will be expressed as the D2 direction and the second direction will be expressed as the D1 direction, but the D1 direction may be expressed as the first direction and the D2 direction may be expressed as the second direction. However, within one embodiment, the first direction and the second direction are not used interchangeably.

In this specification, the terms "arrange" and "arranged" are used as similar terms to, for example, "place/placed", "dispose/disposed," "station/stationed."

In a typical single port SRAM, one unit memory cell includes six transistors, i.e., two load transistors, two driving transistors, and two active transistors, so that it is possible to perform read and write operations sequentially. On the contrary, a dual port SRAM is configured to perform read and write operations in a dual mode by adding two active transistors to the typical single port SRAM, and thus is used in an integrated circuit requiring a high speed.

Figure 1:
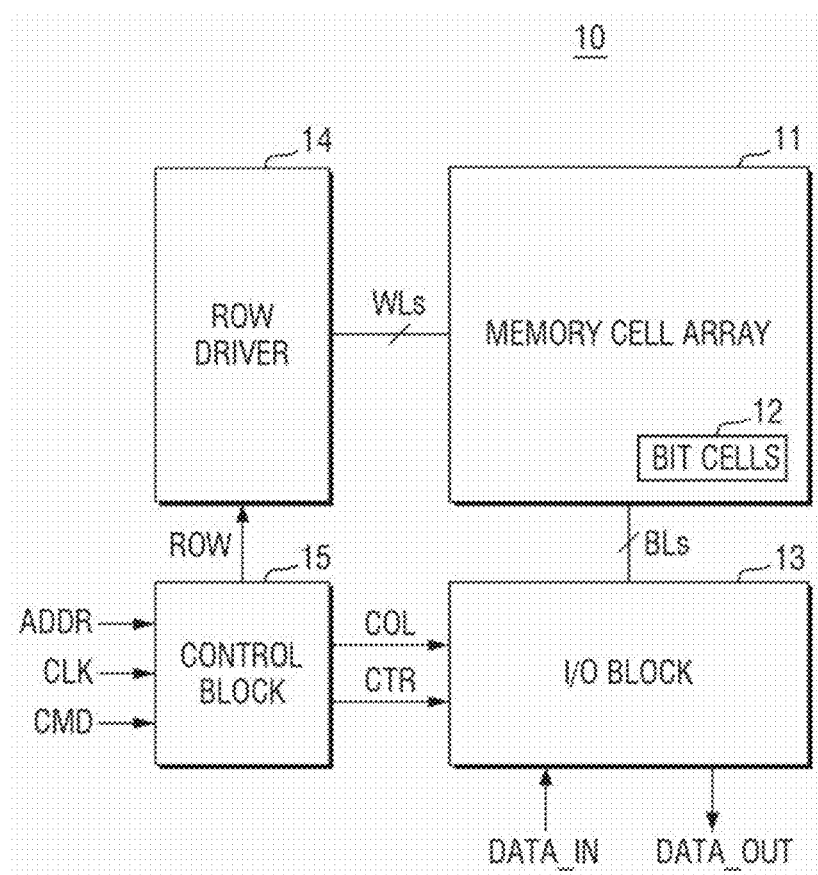
FIG. 1 is a block diagram of a semiconductor device including a static random access memory (SRAM) device according to some embodiments.

FIG. 1 is a block diagram of a semiconductor device including a static random access memory (SRAM) device according to some embodiments.

Referring to FIG. 1, a semiconductor device 10 may include a memory cell array 11, an input/output (I/O) block 13, a row driver 14 and a control block 15. In some embodiments, the semiconductor device 10 may be a memory device. The semiconductor device 10 may receive a command CMD, an address ADDR, a clock CLK, write data DATA_IN, and may output read data DATA_OUT. For example, the semiconductor device 10 may receive the command CMD (may be referred to as "write command") instructing a write operation, the address (may be referred to as "write address"), and the write data DATA_IN, and the write data DATA_IN may be stored in an area of the memory cell array 11 corresponding to the address. Further, the semiconductor device 10 may receive a command CMD (may be referred to as "read command") instructing a read operation and an address (may be referred to as "read address"), and may output the read data DATA_OUT stored in the area of the cell array 11 corresponding to the address to the outside.

The memory cell block 11 may include a plurality of bit cells 12. Each of the bit cells 12 may be connected to one of a plurality of word lines WLs, and may be connected to at least one of a plurality of bit lines BLs.

The row driver 14 may be connected to the memory cell block 11 through the plurality of word lines WLs. The row driver 14 may activate one of the plurality of word lines WLs based on a row address ROW. Accordingly, among a plurality of memory cells, memory cells connected to the activated word line may be selected. That is, the row driver 14 may select any one of the plurality of word lines WLs.

The control block 15 may receive the command CMD, the address ADDR, and the clock CLK, and may generate the row address ROW, a column address COL, and a control signal CTR. For example, the control block 15 may identify the read command by decoding the command CMD, and may generate the row address ROW, the column address COL, and a read signal as the control signal CTR to read the read data DATA_OUT from the memory cell array 11. Further, the control block 15 may identify the write command by decoding the command CMD, and may generate the row address ROW, the column address COL, and a write signal as the control signal CTR to write the data DATA_IN in the memory cell block 11.

The input/output (I/O) block 13 may include a bit line precharge circuit, a column driver, a read circuit, and a write circuit, according to some embodiments.

According to some embodiments, the semiconductor device 10 may further include another device/circuit module (e.g., a logic device, a high frequency device, an image sensing device, a dynamic random access memory (DRAM) device, or a combination thereof) integrated with the SRAM device.

Figure 2:
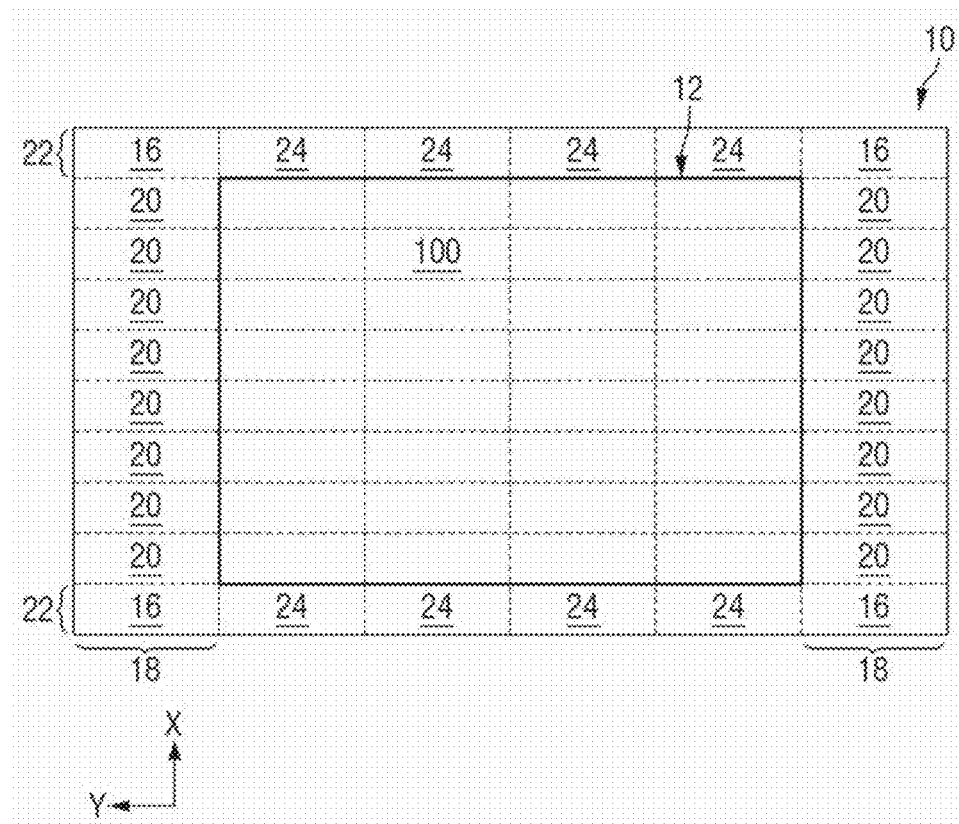
FIG. 2 is a plan view of a semiconductor device including a static random access memory (SRAM) device configured in accordance with some embodiments.

FIG. 2 is a plan view of a semiconductor device including a static random access memory (SRAM) device configured in accordance with some embodiments.

Referring to FIG. 2, the semiconductor device 10 according to some embodiments, for example, the semiconductor device of FIG. 1, includes a static random access memory (SRAM) circuit having a bit cell array 12 (also referred to as SRAM array 12) of a plurality of SRAM unit cells (or SRAM bit cells) 100 configured in an array, and the SRAM unit cells extend in a plurality of columns along a plurality of rows. That is, the SRAM unit cells are arranged in an array of rows and columns.

The semiconductor device 10 may further include another device/circuit module (e.g., a logic device, a high frequency device, an image sensing device, a dynamic random access memory (DRAM) device, or a combination thereof) integrated with the SRAM device.

In some embodiments, each column of the SRAM unit cell 100 in the bit cell array 12 may extend along the first direction X, and each row may extend along the second direction Y. For example, each column may include N1 SRAM unit cells 100 configured in a line (column) along the first direction X, and each row may include N2 SRAM unit cells 100 configured in a line (row) along the second direction Y. That is, the bit cell array 12 may include the SRAM unit cells 100 arranged in N1 rows and N2 columns (N1×N2). In the bit cell array 12 of some embodiments, each column may include 8, 16, 32, 64 or 128 SRAM unit cells 100, and each row may include 4, 8, 16 or 32 SRAM unit cells 100. In the embodiment illustrated in FIG. 2, the bit cell array 12 includes 4 columns and 8 rows.

The semiconductor device 10 may include corner dummy cells 16 disposed at four corners of the bit cell array 12, and edge straps such as word line edge straps (WL edge straps) 18 disposed on row edges of the bit cell array 12 and bit line edge straps (BL edge straps) 22 disposed on column edges of the bit cell array 12. Each WL edge strap 18 may include a plurality of WL edge cells 20 configured in a line along the first direction X, and each BL edge strap 22 may include a plurality of BL edge cells 24 configured in a line along the second direction Y. These edge straps 18 and 22 may be circuit areas that are not designed to function as the SRAM unit cell 100, but are designed to provide other functions.

Figure 3:
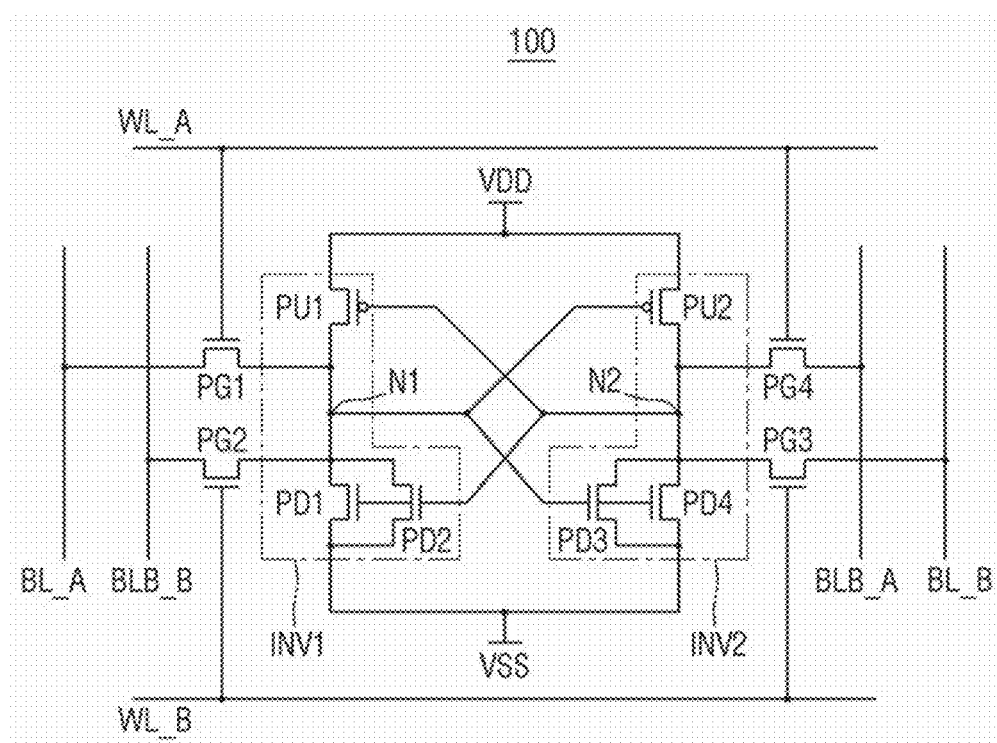
FIG. 3 is a circuit diagram illustrating an SRAM unit cell of the semiconductor device of FIG. 2, according to some embodiments.

FIG. 3 is a circuit diagram illustrating an SRAM unit cell of the semiconductor device of FIG. 2.

Referring to FIG. 3, the SRAM unit cell 100 of a semiconductor device according to some embodiments includes pull-up transistors PU1 and PU2, pull-down transistors PD1, PD2, PD3, and PD4, and passgate transistors PG1, PG2, PG3, and PG4.

The source, drain, and gate of the pull-down transistor PD1 are connected to those of the pull-down transistor PD2. That is, the sources of the pull-down transistor PD1 and the pull-down transistor PD2 are commonly connected to a ground voltage node VSS, the drains of the pull-down transistor PD1 and the pull-down transistor PD2 are commonly connected to a node N1, and the gates of the pull-down transistor PD1 and the pull-down transistor PD2 are commonly connected to a node N2.

The source, drain, and gate of the pull-down transistor PD3 are connected to the source, drain, and gate of the pull-down transistor PD4. That is, the sources of the pull-down transistor PD3 and the pull-down transistor PD4 are commonly connected to the ground voltage node VSS, the drains of the pull-down transistor PD3 and the pull-down transistor PD4 are commonly connected to the node N2, and the gates of the pull-down transistor PD3 and the pull-down transistor PD4 are commonly connected to the node N1.

Accordingly, the pull-down transistors PD1 and PD2 and the pull-down transistors PD3 and PD4 operate as a single pull-down transistor.

The passgate transistors PG1 and PG4 form as a first port A of the SRAM unit cell 100. The passgate transistors PG2 and PG3 form as a second port B of the SRAM unit cell 100. A word line A signal WL_A is applied to the gates of the passgate transistors PG1 and PG4, and a word line B signal WL_B is applied to the gates of the passgate transistors PG2 and PG3. The pull-up transistor PU1 and the pull-down transistors PD1 and PD2 form a first inverter INV1, the pull-up transistor PU2 and the pull-down transistors PD3 and PD4 form a second inverter INV2, the output node N2 of the second inverter INV2 is connected to the input of the inverter INV1, and the output node N1 of the first inverter is connected to the input of the second inverter INV2, thereby forming a latch. The SRAM unit cell 100 stores bits in the latch formed by the pull-up transistors PU1 and PU2 and the pull-down transistors PD1 and PD2. The bits stored in the latch may be read through a bit line port BL_A and a complementary bit line port BLB_A, or may be read through a bit line port BL_B and a complementary bit line port BLB_B. In addition, the bits may be written in the latch through the bit line port BL_A and the complementary bit line port BLB_A, or may be written in the latch through the bit line port BL_B and the complementary bit line port BLB_B.

In the dual port, the bits stored in the SRAM unit cell 100 may be read simultaneously through a port A or a port B. The dual port SRAM unit cell including the port A and the port B may perform a parallel operation. For example, when a read operation is performed in a first SRAM unit cell, a write operation may be simultaneously performed in a second SRAM unit cell belonging to the same column or the same row as the first SRAM unit cell.

Figure 4:
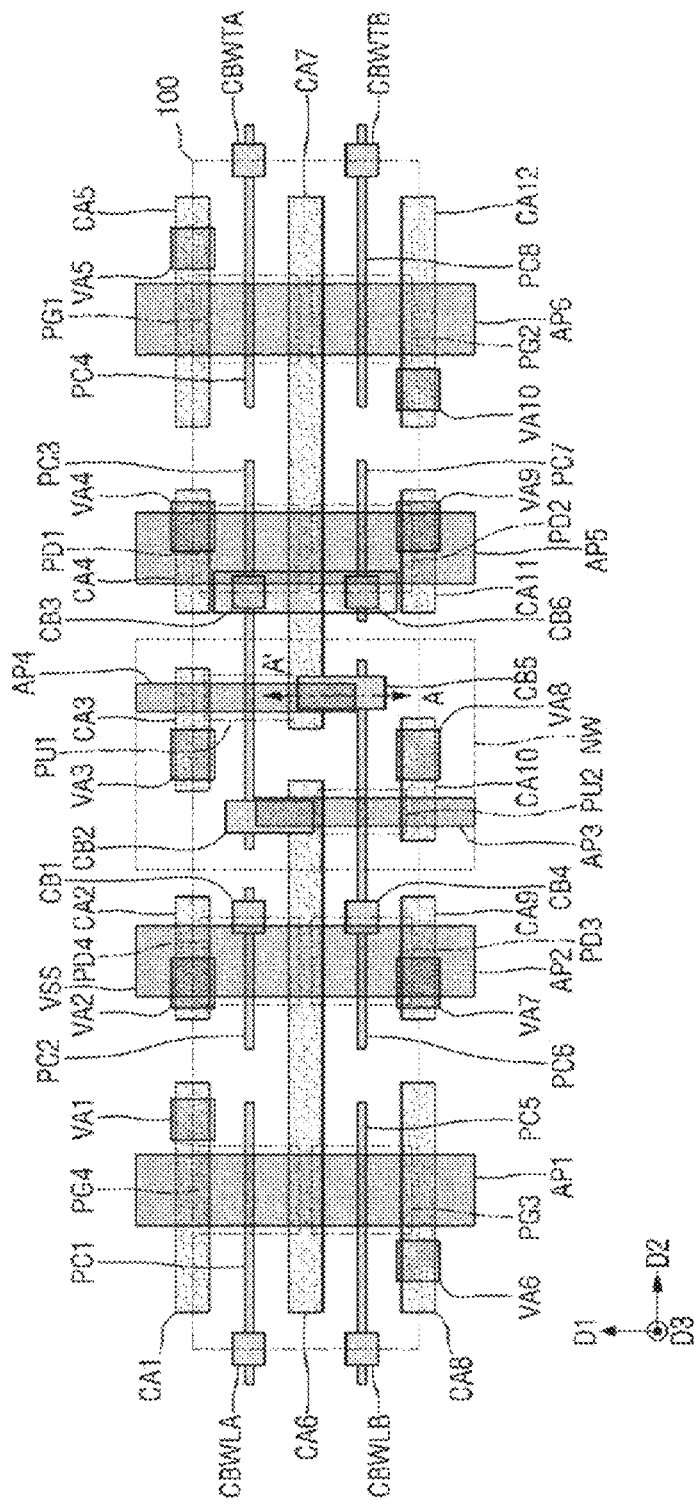
FIG. 4 illustrates an example of a layout including various layout patterns formed on an active contact according to some embodiments.
Figure 5:
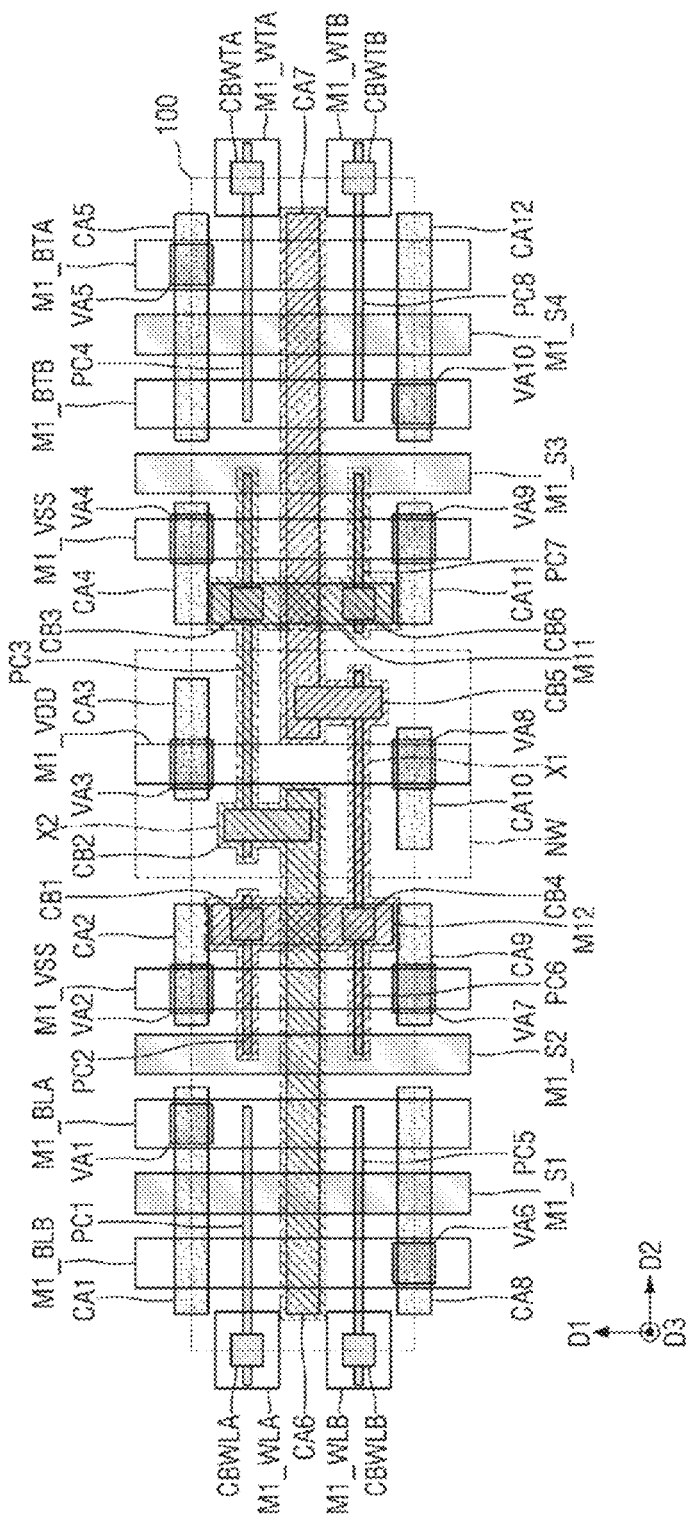
FIG. 5 illustrates layouts illustrating front metal lines formed on the layout of FIG. 4, according to some embodiments.
Figure 6:
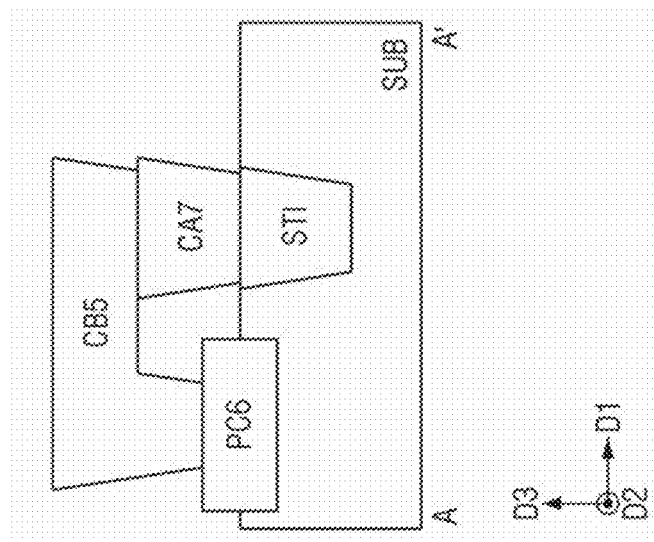
FIG. 6 is a cross-sectional view taken along line A-A' of FIG. 4.

FIGS. 4 and 5 are layout diagrams of an SRAM unit cell according to some embodiments. Specifically, FIG. 4 illustrates various layout patterns formed on an active contact according to some embodiments, and FIG. 5 illustrates layouts illustrating front metal lines formed on the layout of FIG. 4. FIG. 6 is a cross-sectional view taken along line A-A' of FIG. 4.

In some embodiments, each row of SRAM unit cells 100 in an SRAM array 12 may extend along the D1 direction, and each column thereof may extend along the D2 direction. For example, each row may include N1 SRAM unit cells 100 configured in a line (column) along the D1 direction, and each column may include N2 SRAM unit cells 100 configured in a line (rows) along the D2 direction. That is, the SRAM array 12 may include the plurality of SRAM unit cells 100 arranged in N1 rows and N2 columns.

The SRAM unit cell 100 according to some embodiments may include active patterns AP1, AP2, AP3, AP4, AP5, and AP6; active contacts CA1, CA2, CA3, CA4, CA5, CA6, CA7, CA8, CA9, CA10, CA11, and CA12; gate electrodes PC1, PC2, PC3, PC4, PC5, PC6, PC7, and PC8; active vias VA1, VA2, VA3, VA4, VA5, VA6, VA7, VA8, VA9, and VA10; gate vias CB1, CB3, CB4, CB6, CB6, CBWLA, CBWLB, CBWTA, and CBWTB; node formation patterns CB2 and CB5; and metal wiring lines M1_WLA, M1_WLB, M1_BLB, M1_BLA, M1_VDD, M1_VSS, M1_BTB, and M1_BTA, which are formed on a substrate.

In some embodiments, the substrate may be a silicon substrate or silicon-on-insulator (SOT) substrate. In some embodiments, the substrate may include silicon germanium, silicon germanium on insulator (SGOI), indium antimonide, a lead tellurium compound, indium arsenide, indium phosphide, gallium arsenide, or gallium antimonide, but embodiments are not limited thereto.

The active patterns AP1, AP2, AP3, AP4, AP5, and AP6 may be disposed in the SRAM unit cell 100. The active patterns AP3 and AP4 may be disposed in a PMOS region of the SRAM unit cell 100, and the active patterns AP1, AP2, AP5, and AP6 may be disposed in an NMOS region of the SRAM unit cell 100.

The active patterns AP1, AP2, AP3, AP4, AP5, and AP6 may elongate in the D1 direction. In other words, the active patterns AP1, AP2, AP3, AP4, AP5, and AP6 may extend in the D1 direction. The active patterns AP1, AP2, AP3, AP4, AP5, and AP6 may be disposed to be spaced apart from each other in the D2 direction. For example, the active pattern AP3 may be disposed between the active pattern AP2 and the active pattern AP4 which are which are spaced apart from each other in the D2 direction. The active pattern AP4 may be disposed between the active pattern AP3 and the active pattern AP5 which are spaced apart from each other in the D2 direction. The portions of the active pattern AP3 and the active pattern AP4 extending in the D1 direction may partially overlap in the D2 direction. That is, the active pattern AP3 and the active pattern AP4 may be placed in a zigzag pattern in the D1 direction, such that an end of the active pattern AP3 and an end of the active pattern AP4 are staggered in the D1 direction as illustrated in FIG. 4 in which a bottom end of the active pattern AP4 is higher than a bottom end of the active pattern AP3.

The widths (widths in the D2 direction) each of the active patterns AP1, AP2, AP5, and AP6 may be greater than the widths of each of the active patterns AP3 and AP4. That is, the widths of the active patterns AP3 and AP4 in which the pull-up transistors PU1 and PU2 are formed may be narrower than the widths of the active patterns AP1, AP2, AP5, and AP6 in which the other transistors, i.e., the pull-down transistors and the passgate transistors are formed. Further, in the SRAM unit cell 100, the length in the D1 direction of the active patterns AP3 and AP4 may be shorter than the length in the D1 direction of the active patterns AP1, AP2, AP5, and AP6.

The active patterns AP1, AP2, AP3, AP4, AP5, and AP6 may be multi-channel active patterns. For example, the multi-channel active patterns may include a lower pattern and a plurality of sheet patterns. According to some embodiments, the lower pattern may be formed by etching a part of a substrate, and may include an epitaxial layer grown from the substrate. The lower pattern may include silicon or germanium, each of which is an elemental semiconductor material. In some embodiments, lower patterns BP1, BP2, BP3, and BP4 may include a compound semiconductor, for example, a group IV-IV compound semiconductor or a group III-V compound semiconductor.

The group IV-IV compound semiconductor may be a binary compound or a ternary compound including at least two elements selected from the group consisting of carbon (C), silicon (Si), germanium (Ge) and tin (Sn), or the above-mentioned compound doped with a group IV element.

The group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimonium (Sb) which are group V elements.

The sheet pattern may include one of silicon or germanium, each of which is an elemental semiconductor material, and a group IV-IV compound semiconductor or a group III-V compound semiconductor. Each sheet pattern may include the same material as that of the lower pattern, or may include a material different from that of the lower pattern.

In the semiconductor device according to some embodiments, each lower pattern may be a silicon lower pattern containing silicon, and each sheet pattern may be a silicon sheet pattern containing silicon.

The active contacts CA1 to CA12 and the plurality of gate electrodes PC1 to PC8 may extend in the D2 direction, and may be disposed to be spaced apart from each other in the D2 direction. For example, the active contact CA1, the active contact CA2, the active contact CA3, the active contact CA4, and the active contact CA5 may be disposed on the same axis (e.g., a first axis) in the D2 direction, may be disposed to be spaced apart from each other in the D2 direction. The gate electrode PC1, the gate electrode PC2, the gate electrode PC3, and the gate electrode PC4 may be disposed on the same axis (e.g., a second axis) in the D2 direction, and may be disposed to be spaced apart from each other in the D2 direction. The active contact CA6 and the active contact CA7 may be disposed on the same axis (e.g., a third axis) in the D2 direction, and may be disposed to be spaced apart from each other in the D2 direction. The gate electrode PC5, the gate electrode PC6, the gate electrode PC7, and the gate electrode PC8 may be disposed on the same axis (e.g., a fourth axis) in the D2 direction, and may be disposed to be spaced apart from each other in the D2 direction. The active contact CA8, the active contact CA9, the active contact CA10, the active contact CA11, and the active contact CA12 may be disposed on the same axis (e.g., a fifth axis) in the D2 direction, and may be disposed to be spaced apart from each other in the D2 direction. The first to fifth axes in the D2 direction are extend in parallel while being spaced apart from each other in the D1 direction and do not intersect each other.

Active vias VA1 to VA10 may be formed on the active contacts CA1 to CA12. The active contacts CA1 to CA12 and the active vias VA1 to VA10 may be electrically connected. The active contacts CA1 to CA12 and the active vias VA1 to VA10 may transfer a voltage provided to define the source region or the drain region of the transistor to the source/drain region of the transistor.

Gate vias CBWLA, CBWLB, CB1, CB3, CB4, CB6, and CB6 or node formation patterns CB2 and CB5 may be formed on the gate electrodes PC1 to PC8. The gate electrodes PC1 to PC8 and the gate vias CBWLA, CBWLB, CB1, CB3, CB4, CB6, and CB6 may be electrically connected. The gate vias CBWLA, CBWLB, CB1, CB3, CB4, CB6, and CB6 may transfer a gate voltage provided to the gate of the transistor to the gate electrodes PC1 to PC8. The node formation pattern CB2 may extend in the D1 direction to connect the gate electrode PC3 and the active contact CA6. The node formation pattern C35 may extend in the D1 direction to connect the gate electrode PC6 and the active contact CA7. The node N2 (see FIG. 3) may be formed in the SRAM unit cell 100 due to the node formation pattern CB2, and the node N1 (see FIG. 3) may be formed in the SRAM unit cell 100 due to the node formation pattern C35.

The node formation pattern may include the same material as those of the gate vias CBWLA, CBWLB, CB1, CB3, CB4, CB6, and CB6. For example, referring to FIG. 6 showing the cross section of the node formation pattern C35 taken along line A-A', an N-type well region (hereinafter, referred to as 'well region STI') extending in the D2 direction is formed on the substrate by a shallow trench isolation process, and the active contact CA7 for electrically connecting the well region STI is formed to extend in the D2 direction. The gate electrode PC6 is formed on the substrate to extend in the D2 direction while being spaced apart from the active contact CA7 in the D1 direction, and the node formation pattern CB5 extending in the D1 direction is formed between the active contact CA7 and the gate electrode PC6. The active contact CA7 and the gate electrode PC6 are electrically connected through the node formation pattern CB8 to form the node N1.

Although not shown, similarly to the node formation pattern CB5, the node formation pattern CB2 is formed on the active contact CA6 and the gate electrode PC3 to extend in the D1 direction.

The gate electrodes PC1 to PC8 may include a conductive material. For example, each of the gate electrodes PC1 to PC8 may include, for example, at least one of metal, a metal alloy, conductive metal nitride, conductive metal carbonitride, metal silicide, a doped semiconductor material, conductive metal oxide, and conductive metal oxynitride.

Each of the gate electrodes PC1 and PC5 may intersect the active pattern AP1. The gate electrodes PC2 may intersect the active pattern AP2. The gate electrode PC6 may intersect each of the active pattern AP2 and the active pattern AP3. The gate electrode PC4 may intersect each of the active pattern AP4 and the active pattern AP5. The gate electrode PC7 may intersect the active pattern AP5. Each of the gate electrodes PC4 and PC8 may intersect the active pattern AP6.

Each of the gate electrodes PC1 to PC8 may intersect the lower pattern included in each active pattern, and may surround the sheet pattern of each active pattern.

The pull-up transistor PU1 is defined in the region where the gate electrode PC3 and the active pattern AP4 intersect, and the pull-up transistor PU2 is defined in the region where the gate electrode PC6 and the active pattern AP3 intersect. The pull-down transistor PD1 is defined in the region where the gate electrode PC3 and the active pattern AP5 intersect, and the pull-down transistor PD2 is defined in the region where the gate electrode PC7 and the active pattern AP5 intersect. The pull-down transistor PD3 is defined in the region where the gate electrode PC6 and the active pattern AP2 intersect, and the pull-down transistor PD4 is defined in the region where the gate electrode PC2 and the active pattern AP2 intersect. The passgate transistor PG1 is defined in the region where the gate electrode PC4 and the active pattern AP6 intersect, and the passgate transistor PG2 is defined in the region where the gate electrode PC8 and the active pattern AP6 intersect. The passgate transistor PG4 is defined in the region where the gate electrode PC1 and the active pattern AP1 intersect, and the passgate transistor PG3 is defined in the region where the gate electrode PC5 and the active pattern AP1 intersect.

The pull-up transistor PU1 and the pull-down transistor PD1 may include the gate electrode PC3. That is, the first inverter INV1 including the pull-up transistor PU1 and the pull-down transistor PD1 may include the gate electrode PC3. A connection wiring line M11 is disposed to extend in the D1 direction. The gate electrode PC3 of the pull-down transistor PD1 may be electrically connected to the connection wiring line M11 through the gate via CB3, and the gate electrode PC7 of the pull-down transistor PD2 may be electrically connected to the connection wiring line M11 through the gate via CB6. The active contact CA6 may be the drain regions of the pull-down transistor PD3 and the pull-down transistor PD4, and may be the sources or drains of the passgate transistor PG4 and the passgate transistor PG3. The active contact CA2 and the active contact CA9, which are the source regions of the pull-down transistor PD3 and the pull-down transistor PD4, may be electrically connected to the metal wiring lines M1_BLB, M1_BLA, M1_VSS, M1_VDD, M1_BTB, and M1_BTA through the active via VA2 and the active via VA7, respectively.

The pull-down transistor PD3 and the pull-down transistor PD4 may be connected in parallel as illustrated in the circuit of FIG. 3 by connecting the gate electrodes PC2 and PC6 to the same node as the active contact CA7 through a connection wiring line M12, and by electrically connecting the active contact CA6 and the active contacts CA2 and CA9 respectively serving as a source region or a drain region to the same node. The pull-down transistor PD1 and the pull-down transistor PD2 may be connected in parallel as in the circuit of FIG. 3 by connecting the gate electrodes PC3 and PC7 to the same node as the active contact CA6 through the connection wiring line M11, and by electrically connecting the active contact CA7 and the active contacts CA4 and CA11 respectively serving as a source region/drain region to the same node.

The pull-up transistor PU2 and the pull-down transistor PD3 may include the gate electrode PC6. That is, the second inverter INV2 including the pull-up transistor PU2 and the pull-down transistor PD3 may include the gate electrode PC6. The connection wiring line M12 is disposed to extend in the D1 direction. The gate electrode PC6 of the pull-down transistor PD3 may be electrically connected to the connection wiring line M12 through the gate via CB4, and the gate electrode PC2 of the pull-down transistor PD4 may be electrically connected to the connection wiring line M12 through the gate via CB1.

The metal wiring lines M1_BLB, M1_BLA, M1_VSS, M1_VDD, M1_VSS, M1_BTB, and M1_BTA may be disposed to extend in the D1 direction and may intersect the gate electrodes and the active contacts that extend in the D2 direction. The metal wiring lines M1_BLB, M1_BLA, M1_VSS, M1_VDD, M1_VSS, M1_BTB, and M1_BTA may be disposed to extend in the D1 direction while being spaced apart from each other at regular intervals in the D2 direction.

The complementary bit line signal BLB_B (see FIG. 3) is provided to the metal wiring line M1_BLB, the bit line signal BL_A is provided to the metal wiring line M1_BLA, a power ground voltage VSS is provided to the metal wiring line M1_VSS, a power supply voltage VDD is provided to the metal wiring line M1_VDD, the complementary bit line signal BLB_B is provided to the metal wiring line M1_BTB, and the bit line signal BL_A is provided to the metal wiring line M1_BTA.

According to some embodiments, the SRAM unit cell 100 may further include dummy wiring lines M1_S1, M1_S2, M1_S3, and M1_S4. The dummy wiring lines M1_S1, M1_S2, M1_S3, and M1_S4 may be formed by a process different from a process for forming the metal wiring lines M1_BLB, M1_BLA, M1_VSS, M1_VDD, M1_VSS, M1_BTB, and M1_BTA. For example, the metal wiring lines M1_BLB, M1_BLA, M1_VSS, M1_VDD, M1_VSS, M1_BTB, and M1_BTA may be formed first, and then the dummy wiring lines M1_S1, M1_S2, M1_S3, and M1_S4 may be formed. The widths (widths in the D2 direction) of each of the dummy wiring lines M1_S1, M1_S2, M1_S3, and M1_S4 may be smaller than the widths of each of the metal wiring lines M1_BLB, M1_BLA, M1_VSS, M1_VDD, M1_VSS, M1_BTB, and M1_BTA.

The dummy wiring lines M1_S1, M1_S2, M1_S3, and M1_S4 may be disposed between the metal wiring line and the metal wiring line (e.g., a dummy wiring line between adjacent metal wiring lines) in order to make the coupling capacitances generated in the metal wiring lines uniform. The dummy wiring lines M1_S1, M1_S2, M1_S3, and M1_S4 may be alternately arranged with the metal wiring lines in the D2 direction while being spaced apart therefrom at intervals, which in some embodiments may be predetermined intervals. That is, as shown in FIG. 5, the dummy wiring lines M1_S1, M1_S2, M1_S3, and M1_S4 may be arranged in the order of the metal wiring line M1_BLB-the dummy wiring line M1_S1-the metal wiring line M1_BLA-the dummy wiring line M1_S2-the metal wiring line M1_VSS in the D2 direction.

A voltage may be applied to the dummy wiring lines M1_S1, M1_S2, M1_S3, and M1_S4 to reduce capacitance mismatch between adjacent metal wiring lines. In some embodiments, the voltage may be predetermined.

The metal wiring lines M1_BLB, M1_BLA, M1_VSS, M1_VDD, M1_VSS, M1_BTB, and M1_BTA; the dummy wiring lines M1_S1, M1_S2, M1_S3, and M1_S4; and the connection wiring lines M11 and M12 may include, for example, at least one of metal, a metal alloy, conductive metal nitride, conductive metal carbonitride, metal silicide, a doped semiconductor material, conductive metal oxide, or conductive metal oxynitride.

The gate electrodes of the pull-down transistors may include the gate electrodes extending in three D2 directions and the connection wiring lines M11 and M12 extending in one D1 direction, and may be connected in a fork shape or an 'H' shape according to some embodiments. That is, the cascade connection of the pull-down transistors may have a fork shape layout or an 'H' shape layout.

Specifically, the gate electrode PC2, the gate vias CB1 and CB4, the connection wiring line M12, the gate electrode PC6, the node formation pattern CB5, and the active contact CA7 may be electrically connected in a two-pronged fork shape, a hook shape, or an 'H' shape. The gate electrode PC7, the gate vias CB3 and CB6, the connection wiring line M11, the gate electrode PC3, the node formation pattern CB2, and the active contact CA6 may be electrically connected in a two-pronged fork shape, a hook shape, or an 'H' shape. In the following description, the fork shape will be described, but embodiments are not limited to such a fork shape.

The first fork shape of the common node N1 between the first pull-down transistors PD1 and PD2 and the passgate transistors PG1 and PG2 may be disposed to be meshed or engaged with the second fork shape of the node N2 between the second pull-down transistors PD3 and PD4 and the passgate transistors PG3 and PG4 while facing each other. In the present specification, 'disposed to be meshed or engaged' means that the protruding parts that are not in contact with each other are spaced apart from each other in parallel and arranged in a point symmetry or a central symmetry. For example, the first fork shape is point-symmetrical to the second fork shape with respect to the point at which the axes of the active contacts CA6 and CA7 and the metal wiring line M1_VDD intersect.

For simplicity of description, it is assumed that a fork shape X1 including the gate electrode PC7, the gate vias CB3 and CB6, the connection wiring line M11, the gate electrode PC3, and the node formation pattern CB2 is a first fork head, and the active contact CA6 is a first fork body. The first fork head includes a first branch formed by including the gate electrode PC7, the gate vias CB3 and CB6, and the connection wiring line M11, and a first interconnector formed by including the gate electrode PC3 and the connection wiring line M12.

It is assumed that a second fork shape X2 including the gate electrode PC2, the gate vias CB1 and CB4, the connection wiring line M12, the gate electrode PC6, and the node formation pattern CB5 is a second fork head, and the active contact CA7 is a second fork body. The second fork head includes a second branch formed by including the gate electrodes PC2 and PC6 and the connection wiring line M12, and a second interconnector formed by including the gate electrode PC6 and the connection wiring line M11. The fork head and the fork body are arranged to be symmetrical, and the first interconnector and the second interconnector are arranged to be point-symmetrical to each other.

When the pull-down transistors PD3 and PD4 and the pull-down transistors PD1 and PD2 are arranged in an 'H' shape as shown in FIGS. 4 and 5, the pull-down transistor and the passgate transistor have independent strengths and, thus, various design of experiments (DOE) may be performed.

The SRAM unit cell 100 further includes word line wiring lines M1_WLA and M1_WLB providing a word line signal. In FIGS. 4-5, the word line wiring lines M1_WLA and M1_WLB are disposed on the boundary in the D2 direction of the SRAM unit cell 100. That is, the word line wiring line M1_WLA and a word line wiring line W1_WTA may be disposed on the same line as the second axis on which the gate electrodes PC1, PC2, PC3, and PC4 are disposed. The word line wiring line M1_WLB and a word line wiring line W1_WTB may be disposed on the same line as the fourth axis on which the gate electrodes PC5, PC6, PC7, and PC8 are disposed.

The word line wiring lines M1_WLA and M1_WTA provide a word line signal WL_A (see FIG. 2), and the word line wiring lines M1_WLB and M1_WTB provide a word line signal WL_B (see FIG. 2).

The signals of the word lines WL_A and WL_B and the complementary word lines BLB_A and BLB_B of the SRAM unit cell 100 of FIG. 2 are applied to the gate vias CBWLA, CBWLB, CBWTA, and CBWTB (hereinafter, referred to as "word line gate vias." The word line gate via CBWLA receives the word line signal WL_A through the word line wiring line M1_WLA, the word line gate via CBWLB receives the word line signal WL_B through the word line wiring line M1_WLB, the word line gate via CBWTA receives the word line signal WL_A through the word line wiring line M1_WTA, and the word line gate via CBWTB receives the word line signal WL_B through the word line wiring line M1_WTB.

The word line gate via CBWLA provides the word line signal WL_A to the gate electrode PC1 of the passgate transistor PG4, and the word line gate via CBWLB provides the word line signal WL_B to the gate electrode PC5 of the passgate transistor PG3. The word line gate via CBWTA provides the word line signal WL_A to the gate electrode PC1 of the passgate transistor PG1, and the word line gate via CBWLB provides the word line signal WL_B to the gate electrode PC5 of the passgate transistor PG3.

Figure 7:
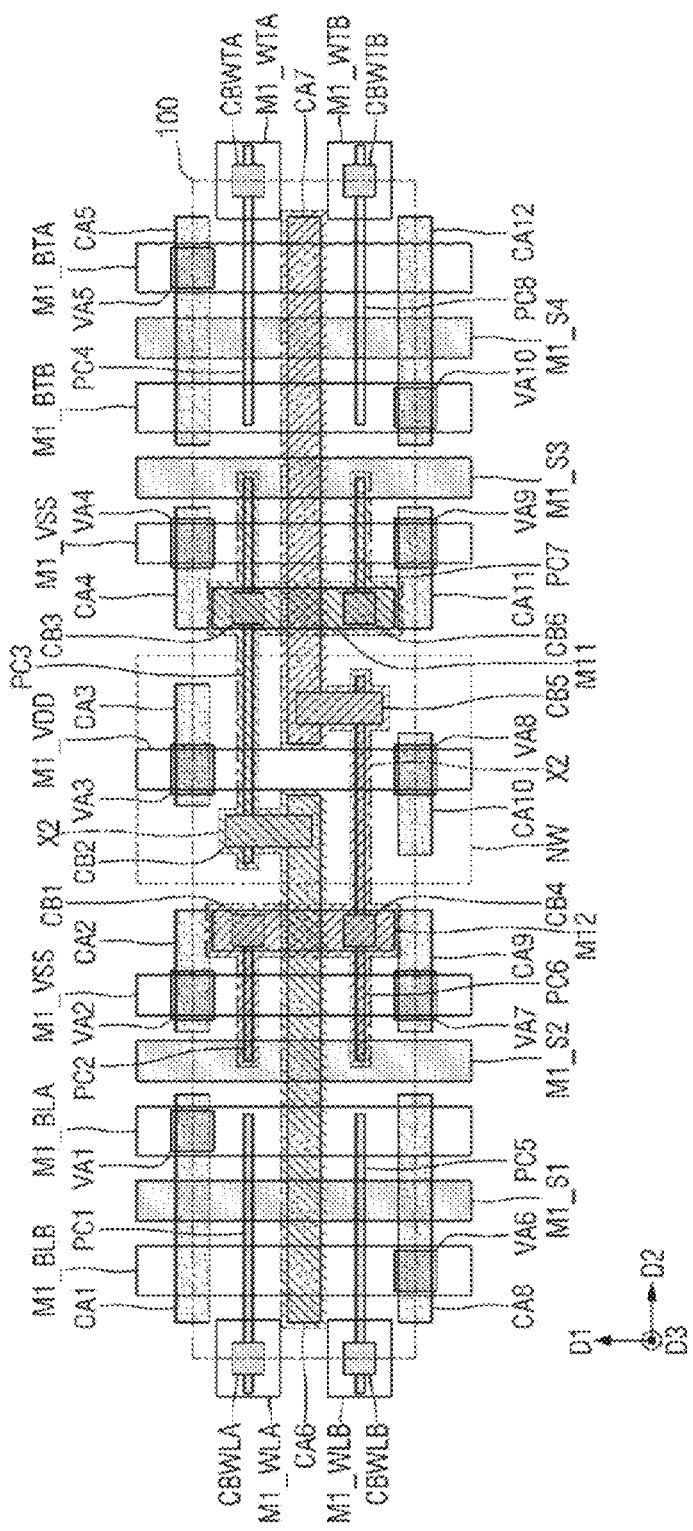
FIG. 7 is a layout diagram of an SRAM unit cell according to some embodiments.

FIG. 7 is a layout diagram of an SRAM unit cell according to some embodiments. For simplicity of description, differences from FIG. 5 will be mainly described.

An SRAM unit cell 100 may include active patterns AP1, AP2, AP3, AP4, AP5, and AP6; active contacts CA1, CA2, CA3, CA4, CA5, CA6, CA7, CA8, CA9, CA10, CA11, and CA12; gate electrodes PC1, PC2, PC3, PC4, PC5, PC6, PC7, and PC8; active vias VA1, VA2, VA3, VA4, VA5, VA6, VA7, VA8, VA9, and VA10; gate vias CB1, CB3, CB4, CB6, CB6, CBWLA, CBWLB, CBWTA, and CBWTB; and node formation patterns CB2 and CB5, which are shown in FIG. 4.

However, in the embodiment of FIG. 7, the gate electrodes PC2 and PC7 may be formed to have lengths different from lengths of the gate electrodes PC2 and PC7 of FIG. 5.

Specifically, according to some embodiments, the end of the gate electrode PC2 in FIG. 5 may be formed to extend across and intersect the boundary in the D2 direction of the connection wiring line M12. The end of the gate electrode PC7 may be formed to extend across and intersect the boundary in the D2 direction of the connection wiring line M11. The gate electrode PC7, the connection wiring line M11, and the gate electrode PC3 form the first branch, and the gate electrode PC2, the connection wiring line M12, and the gate electrode PC6 form the second branch. That is, the first branch included in the first fork shape X1 of FIG. 5 and the second branch included in the second fork shape X2 of FIG. 5 may be formed in an 'H' shape.

According to some embodiments, as shown in FIG. 7, the end of the gate electrode PC2 may be formed only up to the intersection point without crossing over the boundary in the D2 direction of the connection wiring line M12. The end of the gate electrode PC2 may be formed only up to the intersection point without crossing over the boundary in the D2 direction of the connection wiring line M12. The gate electrode PC7, the connection wiring line M11, and the gate electrode PC3 form the first branch, and the gate electrode PC2, the connection wiring line M12, and the gate electrode PC6 form the second branch. That is, the first branch included in the first fork shape X1 of FIG. 7 and the second branch included in the second fork shape X2 of FIG. 7 may be formed in a 'Y' shape.

In the embodiment of FIG. 7, the first fork shape X1 and the second fork shape X2 may be arranged such that the Y-shapes are meshed and engaged with each other. That is, the first fork shape X1 and the second fork shape X2 may be arranged in point symmetry with each other.

Figure 8:
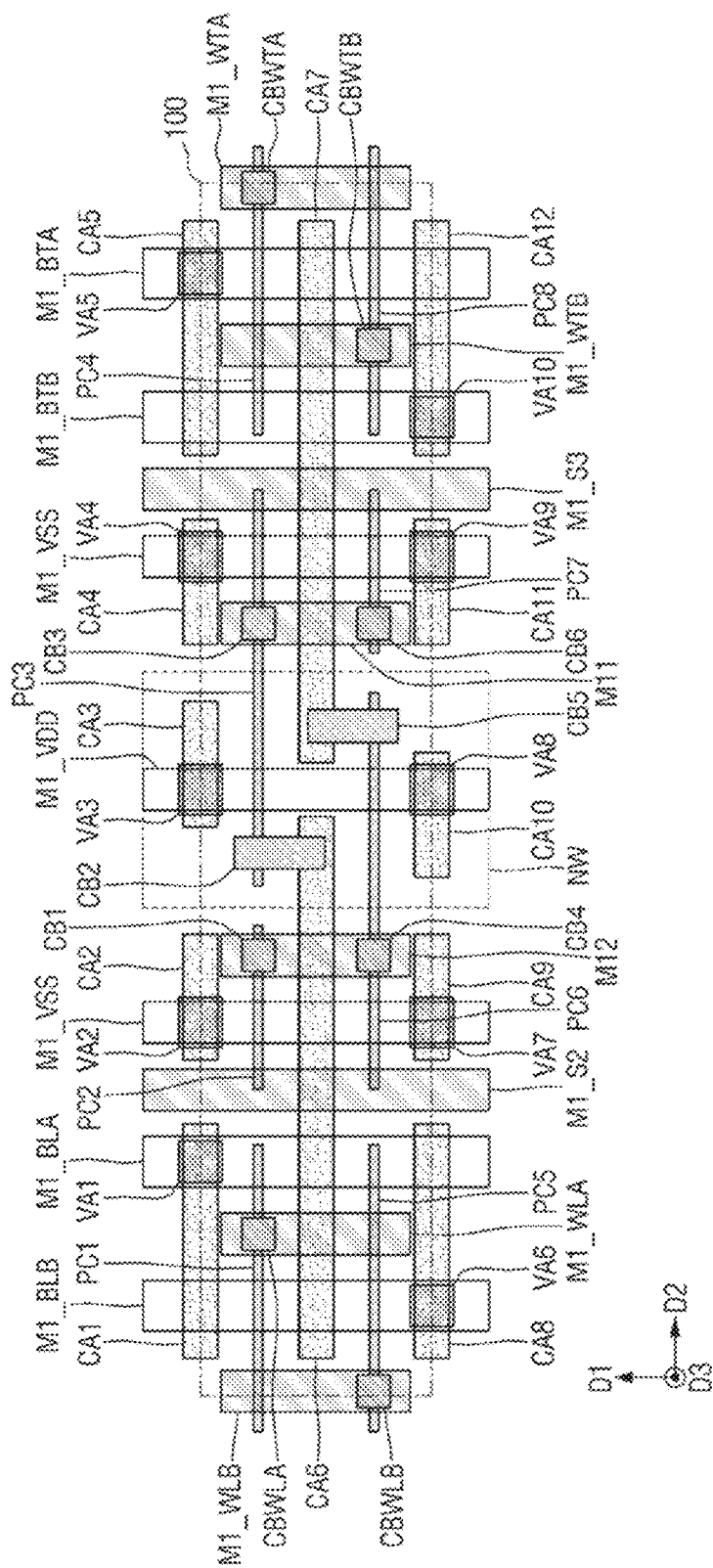
FIG. 8 is a layout diagram of an SRAM unit cell according to some embodiments.

FIG. 8 is a layout diagram of an SRAM unit cell according to some embodiments. For simplicity of description, differences from FIG. 5 will be mainly described.

Referring to FIG. 8, according to some embodiments, an SRAM unit cell 100 may include active patterns AP1, AP2, AP3, AP4, AP5, and AP6; active contacts CA1, CA2, CA3, CA4, CA5, CA6, CA7, CA8, CA9, CA10, CA11, and CA12; gate electrodes PC1, PC2, PC3, PC4, PC5, PC6, PC7, and PC8; active vias VA1, VA2, VA3, VA4, VA5, VA6, VA7, VA8, VA9, and VA10; gate vias CB1, CB3, CB4, CB6, CB6, CBWLA, CBWLB, CBWTA, and CBWTB; and node formation patterns CB2 and CB5, as described with reference to FIGS. 4 and 5.

The SRAM unit cell 100 further includes the metal wiring lines M1_BLB, M1_BLA, M1_VSS, M1_VDD, M1_VSS, M1_BTB, and M1_BTA; the dummy wiring lines M1_S2 and M1_S3; the word line wiring lines M1_WLB, M1_WLA, and M1_WTA; and the connection wiring lines M11 and M12. Unlike the embodiment of FIG. 7, in the unit cell of FIG. 8, the word line wiring lines M1_WLB, M1_WLA, M1_WTB, and M1_WTA are spaced apart from each other in the D2 direction while extending in the D1 direction. The word line wiring line M1_WLB and the word line wiring line M1_WLA are alternately arranged with the metal wiring lines M1_BLB and M1_BLA to which the bit line signal is applied. The word line wiring line M1_WTA and the word line wiring line M1_WTB are alternately arranged with the metal wiring lines M1_BTA and M1_BTB to which the bit line signal is applied. The dummy wiring line M1_S2 is disposed between the metal wiring line M1_BLA and the metal wiring line M1_VSS. The dummy wiring line M1_S3 is disposed between the metal wiring line M1_BTB and the metal wiring line M1_VSS.

The word line wiring lines M1_WLB, M1_WLA, M1_WTB, and M1_WTA intersect the gate electrodes PC1, PC2, PC4, and PC8 extending in the D2 direction, and are electrically connected through the word line gate vias CBWLA, CBWLB, CBWTA, and CBWTB.

Figure 9:
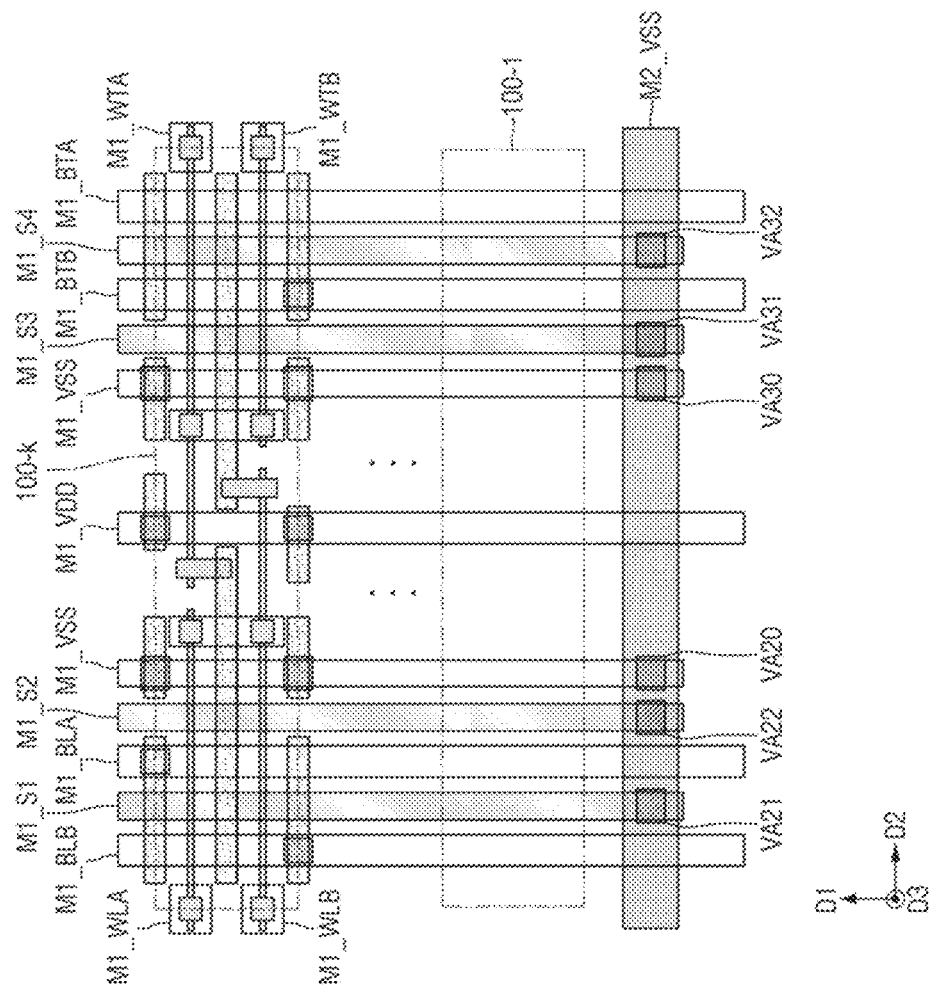
FIGS. 9 and 10 are layout diagrams of an SRAM unit cell according to some embodiments.
Figure 10:
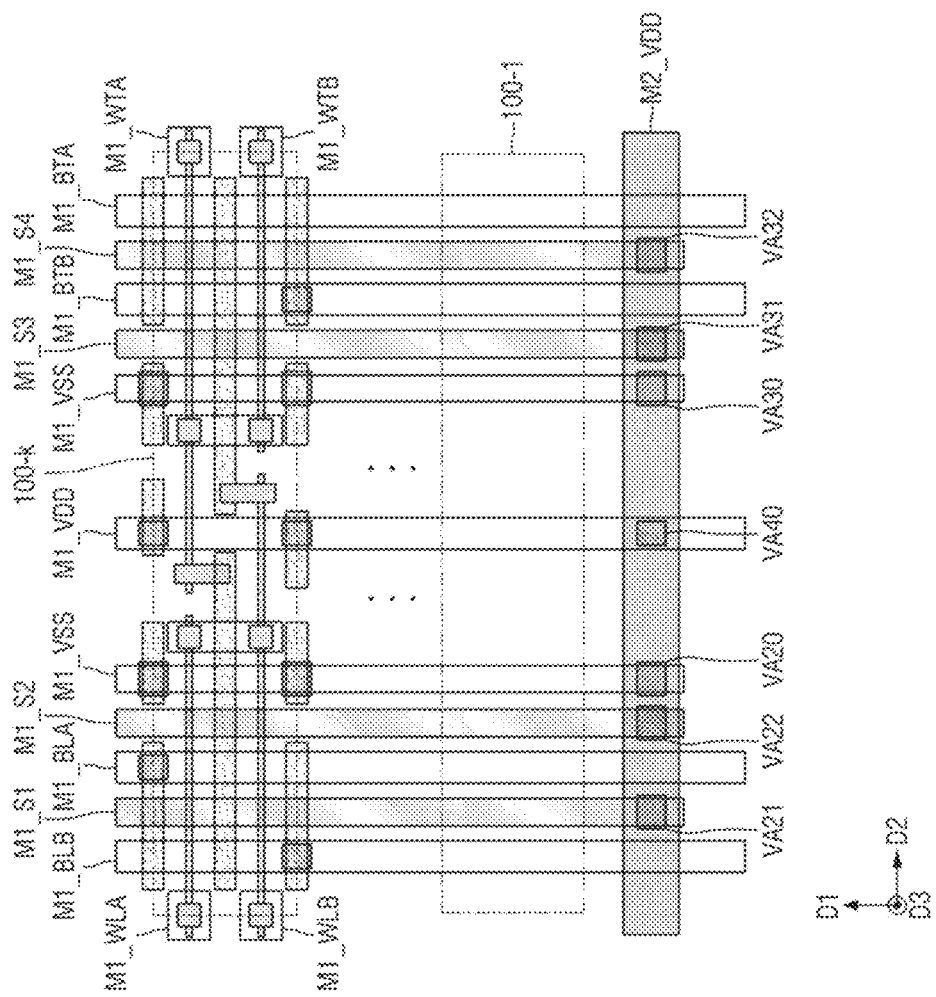

FIGS. 9 and 10 are layout diagrams of an SRAM unit cell according to some embodiments.

Referring to FIGS. 9 and 10, according to some embodiments, the SRAM unit cells 100 are disposed adjacent to each other in the D1 direction. A plurality of SRAM unit cells 100-1 to 100-k are arranged to be electrically connected along the metal wiring lines M1_BLB, M1_BLA, M1_VSS, M1_VDD, M1_VSS, M1_BTB, and M1_BTA and the dummy wiring lines M1_S1, M1_S2, M1_S3, and M1_S4 extending in the D1 direction.

The metal wiring lines M2_VSS or M2_VDD supplying the power ground voltage VSS or the power supply voltage VDD, which are power wiring lines, may be disposed to extend in the D2 direction.

A preset voltage is applied to the dummy wiring lines according to some embodiments. The preset voltage may be, for example, a shield voltage for reducing a coupling capacitance between wiring lines.

For example, as shown in FIG. 9, the dummy wiring lines M1_S1, M1_S2, M1_S3, and M1_S4 may be connected to the power wiring line M2_VSS to which the power ground voltage VSS is provided, and thus may provide the power ground voltage as the shield voltage. When the power ground voltage is provided to the dummy wiring line, the resistance of the power ground voltage VSS of the SRAM unit cell 100 may be reduced, and the coupling capacitance between the metal lines may be increased, thereby improving the read operation margin of the SRAM device 1. The read operation performance of the SRAM device may be improved according to the read operation margin.

For example, as shown in FIG. 10, the dummy wiring lines M1_S1, M1_S2, M1_S3, and M1_S4 may be connected to the power wiring line M2_VDD to which the power supply voltage VDD is provided, and thus may provide the power ground voltage as the shield voltage. When the power supply voltage is provided to the dummy wiring line, the resistance of the power supply voltage VDD of the SRAM unit cell 100 may be reduced, and the coupling capacitance between the metal lines may be increased, thereby improving the read operation margin of the SRAM device 1. The read operation performance of the SRAM device may be improved according to the read operation margin.

Those skilled in the art will appreciate that many variations and modifications can be made to the described embodiments without substantially departing from the principles of the present disclosure. Therefore, the disclosed embodiments are used in a generic and descriptive sense only and not for purposes of limitation.

What is claimed is:

1. An integrated circuit comprising a static random access memory (SRAM) device,
wherein the SRAM device comprises an SRAM unit cell comprising a first output node to which a first pull-up transistor, a first pull-down transistor, and a second pull-down transistor are commonly connected, and a second output node to which a second pull-up transistor, a third pull-down transistor, and a fourth pull-down transistor are commonly connected,
wherein the first output node is connected to a first gate electrode, a second gate electrode, a first connection wiring line, a first node formation pattern, and a first active contact, and
wherein a first layout of the first output node, the first gate electrode, the second gate electrode, the first connection wiring line, the first node formation pattern, and the first active contact disposes a first fork shape.

2. The integrated circuit of claim 1, wherein the second output node is connected to a third gate electrode, a fourth gate electrode, a second connection wiring line, a second node formation pattern, and a second active contact, and a second layout of the second output node, the third gate electrode, the fourth gate electrode, the second connection wiring line, the second node formation pattern, and the second active contact disposes a second fork shape.

3. The integrated circuit of claim 2, wherein the first fork shape and the second fork shape dispose in an H shape.

4. The integrated circuit of claim 2, wherein the first fork shape and the second fork shape are in point symmetry with each other.

5. The integrated circuit of claim 2, wherein the first fork shape and the second fork shape dispose a Y shape.

6. The integrated circuit of claim 1, wherein the SRAM unit cell comprises:
- a plurality of metal wiring lines extending in a second direction, spaced apart from each other in a first direction, and to which a bit line signal, a complementary bit line signal, a power supply voltage, and a power ground voltage are respectively applied; and
- a plurality of dummy wiring lines between the plurality of metal wiring lines, the plurality of dummy wiring lines extending in the second direction and being spaced apart from each other in the first direction.

7. The integrated circuit of claim 1, wherein the SRAM unit cell comprises:
- a plurality of metal wiring lines extending in a second direction, spaced apart from each other in a first direction, and to which a first word line signal, a second word line signal, a first bit line signal, a second bit line signal, a power supply voltage, a power ground voltage, a first complementary bit line signal, and a second complementary bit line signal are respectively applied;
- first dummy wiring lines between a first metal wiring line to which the first bit line signal is applied and a second metal wiring line to which the power ground voltage is applied; and
- second dummy wiring lines spaced apart from each other in the first direction between a third metal wiring line to which the second complementary bit line signal is applied and a fourth metal wiring line to which the power ground voltage is applied.

8. An integrated circuit comprising a plurality of SRAM unit cells each comprising:
- a plurality of gate-all-around transistors;
- a plurality of active patterns sequentially arranged at intervals in a first direction, and extending in a second direction;
- a first gate electrode extending in the first direction of a first axis on the plurality of active patterns;
- a second gate electrode extending in the first direction of a second axis on the plurality of active patterns;
- a first connection wiring line extending in the second direction and crossing the first gate electrode and the second gate electrode on the first gate electrode and the second gate electrode;
- a first node formation pattern extending on the second gate electrode and having a first length in the second direction;
- a first active contact extending in the first direction of a third axis and crossing the first node formation pattern,
- wherein a first input/output node of the SRAM unit cell is connected to the first gate electrode, the second gate electrode, the first connection wiring line, the first node formation pattern, and the first active contact, and
- wherein a first layout of the first input/output node, the first gate electrode, the second gate electrode, the first connection wiring line, the first node formation pattern, and the first active contact disposes a first fork shape.

9. The integrated circuit of claim 8, wherein the first fork shape comprises:
- a first branch comprising a first physical connections among the first gate electrode, the second gate electrode and the first connection wiring line;
- a first interconnector comprising a second physical connection between the second gate electrode and the first connection wiring line; and
- a first fork body comprising the first active contact.

10. The integrated circuit of claim 9, wherein in the first branch, the second gate electrode is disposed to cross over an end of the first connection wiring line, and the first fork shape disposes an H shape.

11. The integrated circuit of claim 9, wherein in the first branch, the second gate electrode is disposed only up to an intersection point with the first connection wiring line, and the first fork shape disposes a Y shape.

12. The integrated circuit of claim 8, wherein each SRAM unit cell further comprises:
- a third gate electrode extending in the first direction of the second axis on the plurality of active patterns;
- a fourth gate electrode extending in the first direction of the first axis on the plurality of active patterns;
- a second connection wiring line extending in the second direction and crossing the third gate electrode and the fourth gate electrode on the third gate electrode and the fourth gate electrode;
- a second node forming pattern extending on the fourth gate electrode and having a second length in the second direction; and
- a second active contact extending in the first direction of the third axis and crossing a second node formation pattern, the second active contact being spaced apart from the first active contact in the first direction,
- wherein a second input/output node of the SRAM unit cell is connected to the third gate electrode, the fourth gate electrode, the second connection wiring line, the second node formation pattern, and the second active contact, and
- wherein a second layout of the second input/output node, the third gate electrode, the fourth gate electrode, the second connection wiring line, the second node formation pattern, and the second active contact disposes a second fork shape.

13. The integrated circuit of claim 12, wherein the first fork shape and the second fork shape are in point symmetry with each other.

14. The integrated circuit of claim 8, wherein each SRAM unit cell comprises:
- a plurality of metal wiring lines extending in the second direction, spaced apart from each other in the first direction, and to which a bit line signal, a complementary bit line signal, a power supply voltage, and a power ground voltage are respectively applied; and
- a plurality of dummy wiring lines between the plurality of metal wiring lines, the plurality of dummy wiring lines extending in the second direction and spaced apart from each other in the first direction.

15. The integrated circuit of claim 14, wherein the power supply voltage or the power ground voltage is applied to the plurality of dummy wiring lines.

16. The integrated circuit of claim 15, further comprising:
- a power wiring line extending in the first direction and to which the power supply voltage or the power ground voltage is applied; and
- a plurality of power gate vias respectively disposed between intersection points of the plurality of dummy wiring lines and the power wiring line, wherein the power supply voltage or the power ground voltage is applied to each of the plurality of dummy wiring lines through the plurality of power gate vias.

17. An integrated circuit comprising:
a first power wiring line extending in a first direction;
a first gate electrode extending in a second direction of a first axis under the first power wiring line;
a second gate electrode extending in the second direction of the first axis under the first power wiring line and spaced apart from the first gate electrode;
a first active contact under the first power wiring line, the first active contact extending in the second direction of a second axis;
a second active contact extending in the second direction of the second axis and disposed to be symmetrical to the first active contact with respect to the first power wiring line;
a third gate electrode under the first power wiring line and extending in the second direction of a third axis;
a fourth gate electrode under the first power wiring line and spaced apart from the third gate electrode, the fourth gate electrode extending in the second direction of the third axis;
a first connection wiring line extending in the first direction and electrically connected to the first gate electrode and the second gate electrode;
a second connection wiring line extending in the first direction and electrically connected to the third gate electrode and the fourth gate electrode;
a first node formation pattern extending in the first direction and configured to electrically connect the second gate electrode and the first active contact; and
a second node formation pattern extending in the first direction and configured to electrically connect the third gate electrode and the second active contact,
wherein a first layout shape in which the first gate electrode, the first connection wiring line, the second gate electrode, the first node formation pattern, and the first active contact are connected is in point symmetry with a second layout shape in which the fourth gate electrode, the second connection wiring line, the third gate electrode, the second node formation pattern, and the second active contact are connected.

18. The integrated circuit of claim 17, wherein the point symmetry is point-symmetrical with respect to an intersection point of the first power wiring line and the second axis in the second direction.

19. The integrated circuit of claim 17, further comprising:
two second power wiring lines, each second power wiring line spaced apart from a respective side of the first power wiring line in the second direction, the two second power wiring lines extending in the first direction;
a first metal wiring line and a second metal wiring line to which a first bit line signal and a second bit line signal are respectively applied, the first metal wiring line and the second metal wiring line being spaced apart in the second direction from a first one of the two second power wiring lines and extending in the first direction, and; and
a third metal wiring line and a fourth metal wiring line to which a first complementary bit line signal and a second complementary bit line signal are respectively applied, the third metal wiring line and the fourth metal wiring line being spaced apart in the second direction from a second one of the two second power wiring lines and extending in the first direction.

20. The integrated circuit of claim 19, further comprising a plurality of dummy wiring lines extending in the first direction, and disposed between the second metal wiring line and the first metal wiring line, between the first metal wiring line and the first one of the two second power wiring lines, between the second one of the two second power wiring lines and the third metal wiring line, and between the third metal wiring line and the fourth metal wiring line.

* * * * *